United States Patent
Wuerfel et al.

(10) Patent No.: US 9,559,286 B2
(45) Date of Patent: Jan. 31, 2017

(54) POSITIONING DEVICE

(75) Inventors: Gernot Wuerfel, Vaihingen/Enz (DE); Ingo Pietsch, Munich (DE); Ingo Kerkamm, Stuttgart-Rohr (DE); Thomas Sebastian, Erdmannhausen (DE); Andreas Jakobi, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 477 days.

(21) Appl. No.: 13/814,679

(22) PCT Filed: Oct. 25, 2011

(86) PCT No.: PCT/EP2011/068656
§ 371 (c)(1),
(2), (4) Date: Jun. 3, 2013

(87) PCT Pub. No.: WO2013/060360
PCT Pub. Date: May 2, 2013

(65) Prior Publication Data
US 2013/0241348 A1 Sep. 19, 2013

(51) Int. Cl.
| | | |
|---|---|---|
| H02N 2/02 | (2006.01) | |
| H01L 41/09 | (2006.01) | |
| F02M 51/06 | (2006.01) | |
| H02N 2/06 | (2006.01) | |
| F02M 63/00 | (2006.01) | |
| F02M 61/08 | (2006.01) | |
| H01L 41/04 | (2006.01) | |
| H01L 41/083 | (2006.01) | |

(52) U.S. Cl.
CPC .......... H01L 41/09 (2013.01); F02M 51/0603 (2013.01); F02M 61/08 (2013.01); F02M 63/0063 (2013.01); H01L 41/042 (2013.01); H02N 2/02 (2013.01); H02N 2/06 (2013.01); H01L 41/0835 (2013.01)

(58) Field of Classification Search
CPC ............ H02N 2/02; H02N 2/021; H02N 2/04; H01L 41/083
USPC .................................................. 310/317, 328
See application file for complete search history.

(56) References Cited

U.S. PATENT DOCUMENTS

| | | | |
|---|---|---|---|
| 2006/0061234 A1* | 3/2006 | Ito .......................... | H02N 2/067 310/317 |
| 2006/0214541 A1* | 9/2006 | Tsuzuki et al. ............... | 310/328 |
| 2007/0096594 A1* | 5/2007 | Maruyama et al. .......... | 310/317 |

FOREIGN PATENT DOCUMENTS

| | | |
|---|---|---|
| DE | 196 24 006 | 12/1997 |
| DE | 199 18 976 | 11/2000 |
| DE | 10 2010 039165 | 2/2012 |
| JP | 2008-29111 | 8/2009 |

(Continued)

OTHER PUBLICATIONS

International Search Report and Written Opinion of the International Searching Authority, PCT International Application No. PCT/EP2011/068656, dated Jun. 6, 2012.

*Primary Examiner* — Derek Rosenau
(74) *Attorney, Agent, or Firm* — Norton Rose Fulbright US LLP; Gerard Messina

(57) ABSTRACT

A positioning device includes a positioning element that is situated movably in a first direction and a second direction, the first and the second directions being opposed to one another, and a first piezoelectric actuator and a second piezoelectric actuator, the first piezoelectric actuator moving the positioning element in the first direction and the second piezoelectric actuator moving the positioning element in the second direction.

8 Claims, 2 Drawing Sheets

(56) References Cited

FOREIGN PATENT DOCUMENTS

WO      WO 03/052260      6/2003

\* cited by examiner

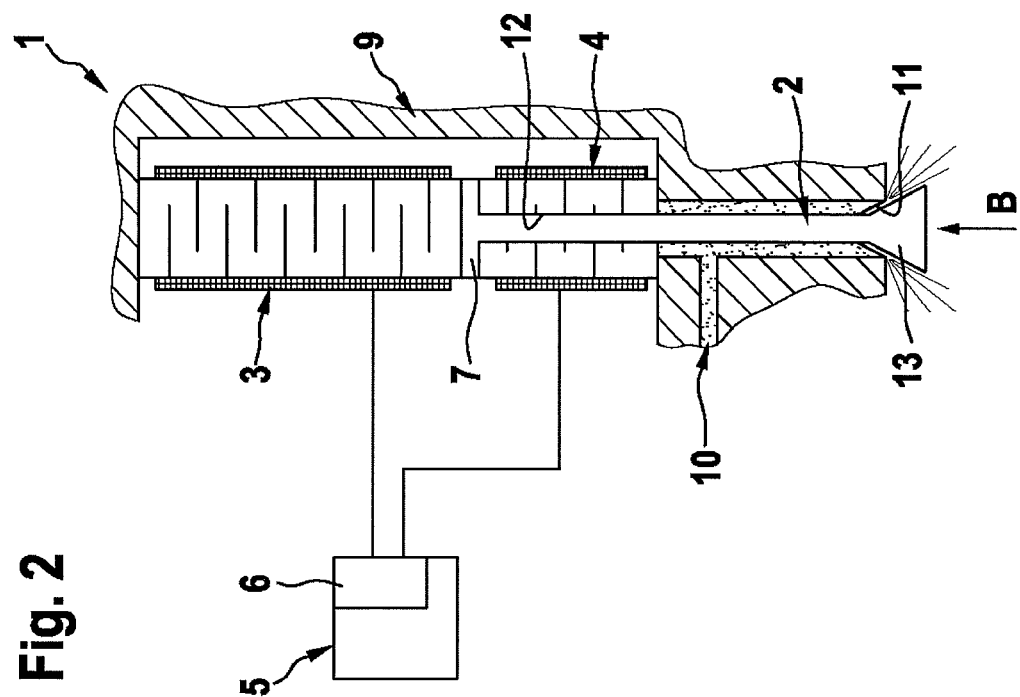
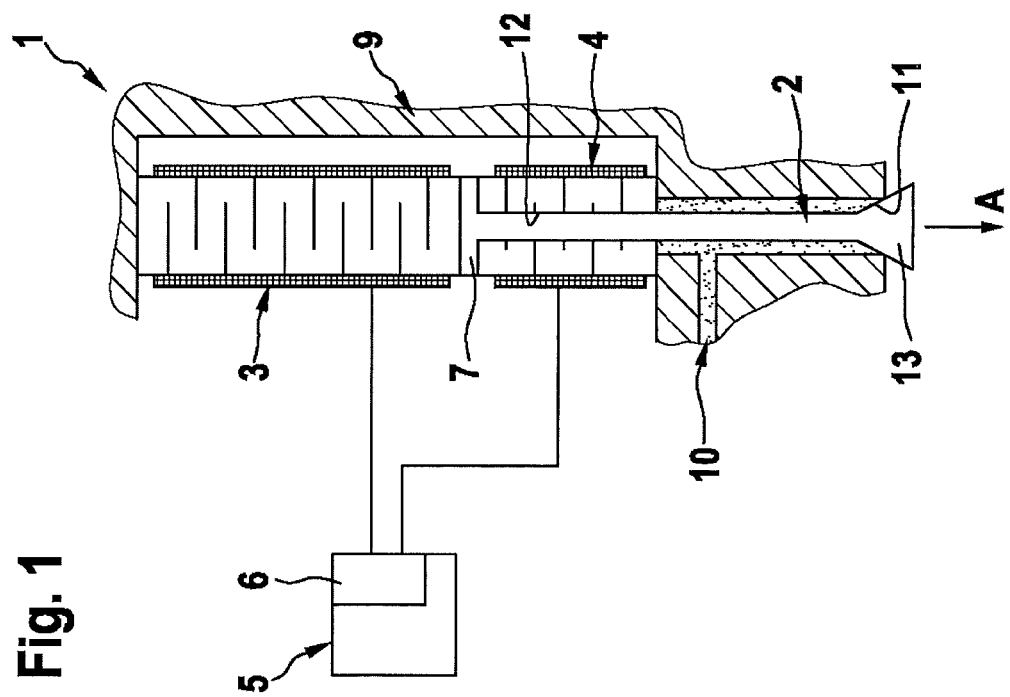

POSITIONING DEVICE

CROSS REFERENCE TO RELATED APPLICATIONS

The present application is the national stage entry of International Patent Application No. PCT/EP2011/068656, filed on Oct. 25, 2011.

FIELD OF INVENTION

The present invention relates to a positioning device.

BACKGROUND INFORMATION

Positioning devices for purposes of fluid injection are known from the related art, in varying embodiments having needle-shaped positioning elements, which are operated with the aid of a ceramic piezoelectric actuator in order to perform rapid injections of fluid. A particular disadvantage of such devices is that as a result of the characteristic degradation of the piezoelectric actuators as a function of the number of electric cycles, it is not possible to establish a direct correlation between the voltage applied and the expansion of the piezoelectric actuator. This means that the actual position of the positioning element cannot be determined exactly at any point in time of the injection process. In addition, every individual piezoelectric actuator has to be measured and coded in the manufacturing process, which is time-consuming and costly, in order to ascertain the individual lifting capacity for metering the fluid.

SUMMARY

The positioning device according to the present invention has the advantage over the related art that in its operation two piezoelectric actuators connected in series are used, which make possible a precise positioning of the positioning element at any point in time of the injection process and thus a more precise metering of the injected fluid. This is achieved according to the present invention by the fact that the positioning device includes a positioning element, which is situated movably in a first direction and a second direction, the first and second directions being opposed to one another. Furthermore the positioning device includes a first piezoelectric actuator and a second piezoelectric actuator, the first piezoelectric actuator moving the positioning element in the first direction, and the second piezoelectric actuator moving the positioning element in the second direction. The manufacturing steps for the measuring and coding of the piezoelectric actuators may thus be omitted, which results in considerable cost savings and markedly shorter manufacturing times.

According to a preferred exemplary embodiment of the present invention, the first piezoelectric actuator moves the positioning element from a starting position into a setting position in the first direction and the second piezoelectric actuator moves the positioning element from the setting position back into the starting position in the second direction. This brings about a reliable opening and closing of the positioning element, with high dynamics.

It is also preferred that the positioning device includes a control unit, which is connected to the first and the second piezoelectric actuators. The control unit is designed to activate or trigger the first and second piezoelectric actuators alternately and also to detect the signals of the deactivated or not triggered piezoelectric actuator. In this process, the deactivated piezoelectric actuator is used as a sensor and detects the force exerted on it by the activated piezoelectric actuator as a signal which may be used to determine the position of the positioning element. This information makes it possible to determine the precise expansion of the first piezoelectric actuator and thus also the lifting movement of the positioning element. Complex measuring to select the piezoelectric actuators to be used may thus be omitted from the manufacturing stage.

In a further advantageous exemplary embodiment of the present invention the control unit includes an arithmetic unit which is designed to calculate an exact position of the positioning element on the basis of the detected signals from the respective deactivated piezoelectric actuator. Due to the calculated positioning of the piezoelectric actuator at any point in time of the injection process, the fluid metering may be significantly more precise than is the case with conventional coding of the piezoelectric actuator. As a result of the deletion of the complex feed-forward correction functions formerly needed in the control unit to correct the injected fluid quantity, it is also possible to simplify significantly the design and configuration of the control unit. In addition, by balancing the detected fluid quantity actually injected and the setpoint quantity defined by the control unit it is possible to make a tuning, for example by inserting a further control unit which alters the setpoint quantity, significantly more difficult.

It is preferable for the first piezoelectric actuator and/or the second piezoelectric actuator to be in direct contact with the positioning element. Direct operation of the positioning element allows components to be omitted, minimizing the number of components and resulting in considerable cost savings.

In a further advantageous exemplary embodiment of the present invention, the second piezoelectric actuator has a passage through which the positioning element is guided. This ensures that the positioning element is guided in a reliable manner causing low wear. Appropriate adaptation of the design of the inner electrode of the second piezoelectric actuator avoids electrical flashovers at the passage onto the positioning element.

It is also preferable that the positioning element is a needle having at one end a flat foot piece situated between the first and second piezoelectric actuator. This enables mechanical faults, such as jamming of the positioning element, or wear, resulting for example from coking of the positioning element and/or nearby components to be diagnosed more easily, as a result of the simple configuration of the positioning device.

It is preferable for the positioning device to include a spring element to assist in a reset of at least one of the piezoelectric actuators. This permits a faster closing of the positioning element, which is pressed into a valve seat at a higher reset speed and with greater reset force, thereby allowing, for example in use in a vehicle, a significantly reduced fluid quantity to be injected into the combustion chamber. This results in improved idling and emission behavior of the engine.

The present invention also relates to a method for positioning a positioning device having a positioning element, a first piezoelectric actuator and a second piezoelectric actuator. In a first method step, the first piezoelectric actuator is activated in a first direction, in order to move the positioning element from a starting position into a setting position. In this process the deactivated second piezoelectric actuator operates as a sensor, which detects the forces from the positioning element exerted on it and transmits them to the control unit. In a second method step, the first piezoelectric actuator is deactivated and the second piezoelectric actuator is activated in a second direction, in order to return the positioning element from the setting position back into the starting position. In this step the first piezoelectric actuator operates as a sensor and detects the forces acting on the second piezoelectric actuator, and transmits them to the control unit. On the basis of the transmitted signals, the control unit calculates an exact position of the positioning element. The simple control process makes it possible to implement reliable and inexpensive control of the positioning element. Using the method according to the present invention, a fluid quantity may be determined significantly more accurately than via the conventional piezoelectric actuator selection at the manufacturing stage, resulting in a considerable increase in the efficiency of combustion engines on which the positioning device is utilized. A less expensive manufacture of the positioning device with a small number of manufacturing steps and shorter cycle times is also achievable. As an alternative, the positioning element according to the present invention may also be operated indirectly by way of a servo valve having a motion reversal feature, permitting utilization in a broad range of combustion engines.

A preferred exemplary embodiment of the method makes it possible to determine, on the basis of the calculated position of the positioning element, an opening time for a fluid injection, in particular a fuel injection or a fuel injection using compressed air. As a result, even in injection processes at very high frequency or having very short cycle times it is possible to achieve a precise metering of the fluid in all load ranges of the combustion engine.

Exemplary embodiments according to the present invention are described in the following in greater detail, with reference to the accompanying drawings.

BRIEF DESCRIPTION OF THE DRAWINGS

FIG. 1 shows a partial sectional view of a positioning device according to a first preferred exemplary embodiment of the present invention.

FIG. 2 shows a further partial sectional view of the positioning device shown in FIG. 1.

DETAILED DESCRIPTION

In the following, a positioning device according to a first preferred exemplary embodiment of the present invention is described in greater detail, with reference to FIGS. 1 through 4.

Figure 3:
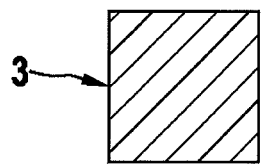
FIG. 3 shows a cross-sectional view of a first piezoelectric actuator of the first exemplary embodiment.
Figure 4:
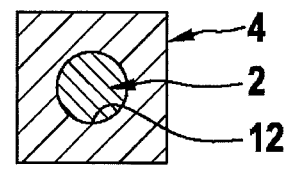
FIG. 4 shows a cross-sectional view of a second piezoelectric actuator of the first exemplary embodiment.

FIG. 1 shows a partial sectional view of a positioning device 1 according to the first exemplary embodiment of the present invention. Positioning device 1 includes a positioning element 2, a first piezoelectric actuator 3 and a second piezoelectric actuator 4, which are preferably designed as ceramic multilayer piezoelectric actuators and are situated in a housing 9, to which a fluid is supplied via a fuel line 10. In addition, positioning device 1 includes a control unit 5, situated outside housing 9, and an arithmetic unit 6 provided therein which is electrically connected to first piezoelectric actuator 3 and second piezoelectric actuator 4. First and second piezoelectric actuators 3, 4 each have a square cross section, as shown in FIGS. 3 and 4. Alternatively the piezoelectric actuators could also have a circular cross section. Positioning element 2 designed as a needle has a flat foot piece 7, which is situated between first and second piezoelectric actuators 3, 4 and is in direct contact with first and second piezoelectric actuators 3, 4. A neck piece 12 of positioning element 2 connected to foot piece 7, as is apparent in the cross-sectional view in FIG. 4, is guided through a passage 12 formed in second piezoelectric actuator 4. An end piece 13 of positioning element 2 situated at the opposite end from foot piece 7 is in the form of a cone and closes off a valve seat 11 situated opposite it in housing 9. FIG. 1 shows a starting position of positioning element 2, which is the closed position.

In line with the method according to the present invention, in order to open positioning device 1, first piezoelectric actuator 3 is activated or triggered by control unit 5 in a first direction A, shown as an arrow. As a result of the electrical energization, or the electrical load, first piezoelectric actuator 3 expands and positioning element 2, in contact with foot piece 7, is moved from a starting position into a setting position. Second piezoelectric actuator 4, supported on housing 9 and in contact with foot piece 7, being situated opposite it, which is deactivated or not triggered, is compressed in this process by the force generated by first piezoelectric actuator 3. In this context it should be noted that the expression "deactivated" is to be understood in the sense of "in the idle condition or idle position," in which state second piezoelectric actuator 4, at this moment not under electrical load and not used for moving positioning element 2, is merely compressed and switched into the form of a sensor which detects the forces from positioning element 2 acting on it. The sensor signals of second piezoelectric actuator 4 detected in this process are transmitted to arithmetic unit 6 in control unit 5, which on the basis thereof calculates an exact position of positioning element 2.

As shown in FIG. 2, as a result of the expansion of first piezoelectric actuator 3 in first direction A, end piece 13 of positioning element 2 lifts off valve seat 11 into the setting position, so that the fluid supplied via fuel line 10 may flow to the outside of housing 9.

In order to move positioning element 2 back onto valve seat 11, i.e., to close positioning device 1, now second piezoelectric actuator 4 is activated by control unit 5 and first piezoelectric actuator 3 is deactivated. In this process second piezoelectric actuator 4 expands and moves positioning element 2 from the setting position shown in FIG. 2 in a second direction B, shown by an arrow, back into the starting position. As a result, deactivated first piezoelectric actuator 3 is compressed, now being switched as a sensor in order to detect the force exerted on it by second piezoelectric actuator 4 and transmit it in the form of sensor signals to arithmetic unit 6 in control unit 5, on the basis of which arithmetic unit 6 again calculates an exact position of positioning element 2.

On the basis of the calculated and known positions of positioning element 2 at any point in time in the injection process, the so-called needle travel pattern, the required fluid quantity may be determined with significantly greater precision than by the piezoelectric actuator measuring and coding before installation conventionally used in the related art. This results in major fuel savings potentials.

Figure 5:
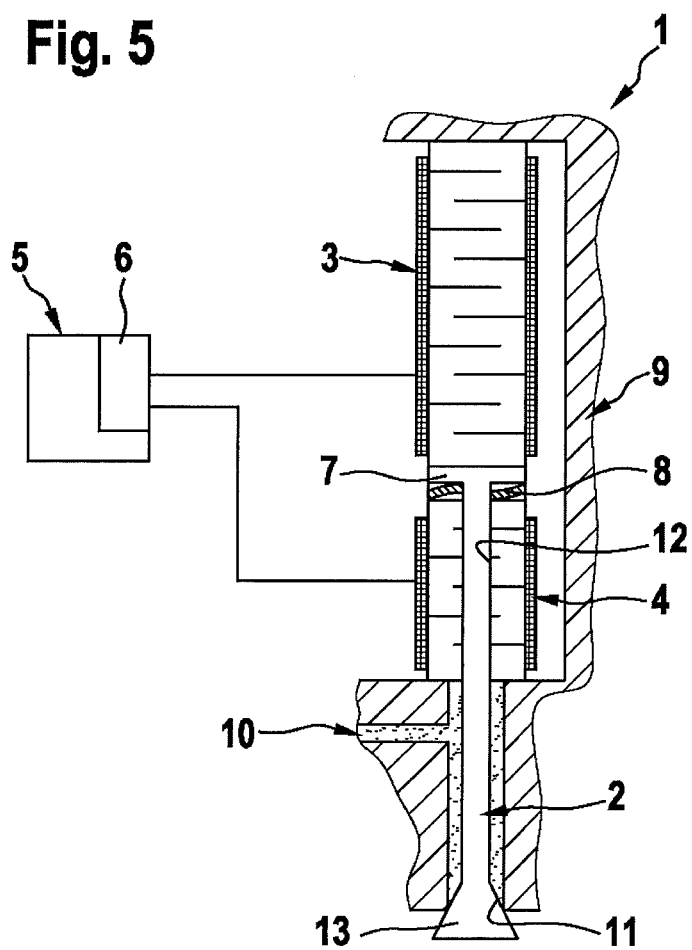
FIG. 5 shows a partial sectional view of the positioning device according to a second preferred exemplary embodiment of the present invention.

In the following a positioning device according to a second preferred exemplary embodiment of the present invention is described in greater detail, with reference to FIG. 5. Identical or functionally identical components are identified here with the same reference numerals as in the first exemplary embodiment.

In contrast with the first exemplary embodiment described above, the second exemplary embodiment features a spring element 8 to assist in a reset of positioning element 2. Spring element 8 is situated between second piezoelectric actuator 4 and foot piece 7 of positioning element 2. As an alternative, spring element 8 may also be situated between second piezoelectric actuator 4 and housing 9. This enables a faster closing of positioning element 2 to be implemented.

Although not shown in the figures, it is possible with all described exemplary embodiments for a hydraulic coupler to be additionally situated or connected downstream between first piezoelectric actuator 3 and housing 9, in order to provide for a length compensation resulting from heat.

Positioning device 1 according to the present invention has the advantage that by the use and separate triggering of two piezoelectric actuators 3, 4 installed in series, one of the piezoelectric actuators may always operate as a sensor and determine an exact position of positioning element 2. Thus a more precise determination of the fluid quantity is achieved, both with directly and with indirectly operated piezoelectric actuators. This in turn enables the fuel consumption or the emission behavior to be further reduced and the engine to operate at or below limitations to be prescribed in the future.

What is claimed is:

1. A positioning device comprising:
   a positioning element, which is situated movably in a first direction and a second direction, the first and second directions being opposed to each other;
   a first piezoelectric actuator configured to move the positioning element in the first direction; and
   a second piezoelectric actuator that is configured to move the positioning element in the second direction and that includes a passage through which the positioning element is guided.

2. The positioning device according to claim 1, wherein the first piezoelectric actuator moves the positioning element from a starting position into a setting position in the first direction, and the second piezoelectric actuator moves the positioning element from the setting position back into the starting position in the second direction.

3. The positioning device according to claim 1, further comprising:
   a control unit, which is connected to the first and second piezoelectric actuators and is configured to activate alternately the first and second piezoelectric actuators, and which is also configured to detect signals from a respective deactivated one of the piezoelectric actuators.

4. The positioning device according to claim 3, wherein the control unit includes an arithmetic unit, which is configured to calculate an exact position of the positioning element on a basis of the detected signals of the respective deactivated piezoelectric actuator.

5. The positioning device according to claim 1, wherein at least one of a) the first piezoelectric actuator is in direct contact with the positioning element, and b) the second piezoelectric actuator is in direct contact with the positioning element.

6. The positioning device according to claim 1, further comprising:
   a spring element configured to assist in a reset of at least one of the piezoelectric actuators.

7. The positioning device according to claim 1, wherein the first piezoelectric actuator is configured to apply the force in the first direction when the first piezoelectric actuator is energized, and the second piezoelectric actuator is configured to apply the force in the second direction when the second piezoelectric actuator is energized.

8. A positioning device comprising:
   a positioning element, which is situated movably in a first direction and a second direction, the first and second directions being opposed to each other;
   a first piezoelectric actuator configured to move the positioning element in the first direction; and
   a second piezoelectric actuator configured to move the positioning element in the second direction, wherein the positioning element is a needle, which has at one end a flat foot piece situated between the first and second piezoelectric actuators.

* * * * *